(12) United States Patent
Jurzitza (10) Patent No.: US 8,143,945 B2
(45) Date of Patent: Mar. 27, 2012

(54) SWITCHED MODE AMPLIFIER

(75) Inventor: Dieter Jurzitza, Karlsruhe (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 0 days.

(21) Appl. No.: 12/920,017

(22) PCT Filed: Feb. 18, 2009

(86) PCT No.: PCT/EP2009/001116
§ 371 (c)(1),
(2), (4) Date: Oct. 15, 2010

(87) PCT Pub. No.: WO2009/106249
PCT Pub. Date: Sep. 3, 2009

(65) Prior Publication Data
US 2011/0032034 A1 Feb. 10, 2011

(30) Foreign Application Priority Data

Feb. 28, 2008 (EP) .................................... 08003732

(51) Int. Cl.
*H03F 3/217* (2006.01)
(52) U.S. Cl. ..................................... 330/251; 330/207 A
(58) Field of Classification Search .............. 330/207 A, 330/251
See application file for complete search history.

(56) References Cited

U.S. PATENT DOCUMENTS

| | | | |
|---|---|---|---|
| 5,442,317 A * | 8/1995 | Stengel | 330/10 |
| 5,610,553 A | 3/1997 | Kirn | |
| 6,304,137 B1 * | 10/2001 | Pullen et al. | 330/251 |
| 7,307,474 B2 * | 12/2007 | Nguyen | 330/251 |
| 2003/0001547 A1 | 1/2003 | Jurzitza | |

* cited by examiner

*Primary Examiner* — Khanh Nguyen
(74) *Attorney, Agent, or Firm* — O'Shea Getz P.C.

(57) ABSTRACT

A switched mode amplifier includes a voltage source, a switched amplifier, a controller and a feedback unit. The switched amplifier sources or sinks a current to or from a load. The load and the current define a voltage over the load. The controller generates control signals for the switched amplifier in response to an input signal and a feedback signal. The feedback unit is connected to the controller and the load, and generates the feedback signal from the voltage over the load.

12 Claims, 11 Drawing Sheets

| Mode | First Switch | Second Switch | Third Switch | Fourth Switch | Fifth Switch | Sixth Switch |
|---|---|---|---|---|---|---|
| M1 | Either Open or Close | Constantly Open | Constantly Close | Constantly Close | Constantly Open | Constantly Open |
| M2 | Either Open or Close | Either Open or Close | Constantly Open | Either Open or Close | Constantly Close | Constantly Open |
| M3 | Constantly Open | Constantly Open | Constantly Close | Either Open or Close | Constantly Open | Constantly Close |
| M4 | Constantly Open | Constantly Close | Constantly Open | Constantly Open | Either Open or Close | Constantly Close |

SWITCHED MODE AMPLIFIER

1. CLAIM OF PRIORITY

This patent application claims priority from PCT patent application PCT/EP2009/00116 filed Feb. 18, 2009, which is hereby incorporated by reference.

2. FIELD OF TECHNOLOGY

The invention relates generally to switch mode amplifiers.

3. RELATED ART

A conventional switched mode audio amplifier includes an audio amplifier and a power supply. The audio amplifier typically includes a delta-sigma modulator for delta-sigma modulating an audio signal. An output pulse signal from the delta-sigma modulator is supplied to a power switching element in the amplifier, and then output via an output filter in the amplifier. The power supply is connected to the power switching element in the amplifier. The power supply receives a clock signal and performs pulse width modulation in synchronization with this clock signal. The power supply supplies the pulse width modulated signal to a power switching element in the power supply, and supplies power to the power switching element in the amplifier via an output filter in the power supply.

A signal such as an audio signal and a sampling clock are input into the delta-sigma modulator. The input signal is delta-sigma modulated by the delta-sigma modulator, and the output pulse signal of the input signal is input into the power switching element in the amplifier. A different clock signal from the sampling clock signal is input to the power supply. Pulse width modulation is performed in synchronization with the clock signal and the pulse width modulated output pulse signal is input into the power switching element in the power supply. The output of the power switching element in the power supply is output through an output filter in the power supply. The filtered output powers the power switching element in the amplifier.

Typically, the power supply and the power amplifier are configured independent of one another. Switching noise from the power supply, therefore, can affect the output of the power amplifier. To prevent switching noise from affecting the power amplifier, a large output filter is installed at the output of the power supply. This output filter typically includes a smoothing circuit connected to a noise filter. Disadvantageously, such a noise filter can be difficult to miniaturize. The noise filter, however, can be omitted by enlarging a capacitor and a choke coil in the smoothing circuit of the output filter. Disadvantageously, the enlarged capacitor and choke coil may prevent miniaturization.

To overcome the aforesaid problems, the switched power supply, controlled by a respective input signal, may be used as the switched power amplifier. Such arrangements, however, do not produce satisfactory sound quality. In particular, relatively large non-linear distortions are produced where energy is fed back, for example, by an inductive load such as a loudspeaker.

It is an object of the invention to provide a practical and efficient way of amplifying an audio signal with low distortion.

SUMMARY OF THE INVENTION

A switched mode amplifier includes a supply voltage source, a switched amplifier, a controller and a feedback unit. The switched amplifier sources or sinks a current to or from a load. The load and the current define a voltage over the load. The switched amplifier includes an inductor, a plurality of controllable switches and a plurality of diodes. The inductor is connected between first and second nodes. A first one of the switches is connected between the first node and a third node. A second one of the switches is connected between the first node and a fourth node. A third one of the switches and a first one of the diodes are connected between the first node and a fifth node. A fourth one of the switches is connected between the second and the fourth nodes. A fifth one of the switches and a second one of the diodes are connected between the second node and the fifth node. A sixth one of the switches and a third one of the diodes is connected between the first node and the second node. The supply voltage source is connected between the third and the fourth nodes. The load is connected between the fifth and the fourth nodes. The controller generates control signals for the switched amplifier in response to an input signal and a feedback signal. The controller controls the switches using the control signals. The feedback unit is connected to the controller and the load, where the feedback unit generates the feedback signal from the voltage over the load.

These and other objects, features and advantages of the present invention will become more apparent in light of the following detailed description of preferred embodiments thereof, as illustrated in the accompanying drawings.

DESCRIPTION OF THE DRAWINGS

The invention can be better understood with reference to the following drawings and description. The components in the figures are not necessarily to scale. Emphasis is placed instead upon illustrating the principles of the invention. Moreover, in the figures, like reference numerals designate corresponding parts. In the drawings.

DETAILED DESCRIPTION OF THE INVENTION

Figure 1:
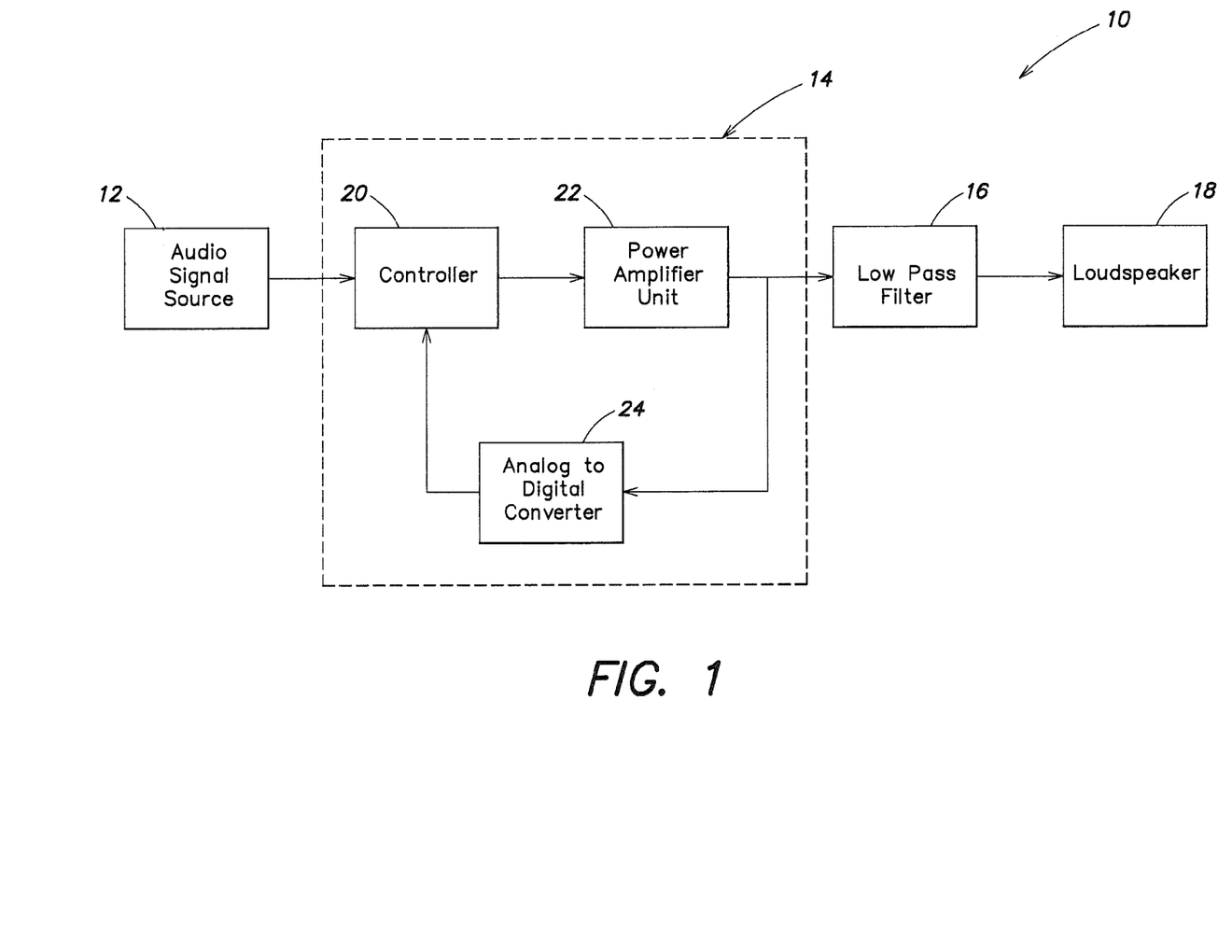
FIG. 1 schematically illustrates an embodiment of an audio amplifier system.

FIG. 1 is a block diagram illustration of an embodiment of an audio system 10 that includes an audio signal source 12, an amplifier unit 14, a low pass filter (LPF) 16 and a loudspeaker 18. The amplifier unit 14 includes a controller 20, a power amplifier 22 and an Analog-to-Digital (AD) converter 24.

The audio signal source 12, for example a CD player, an mp3 player, a radio tuner, etc., generates a digital audio signal. The audio signal predominantly includes frequency components in an audible range; e.g., between approximately 20 and 22 kHz. The audio signal source 12 provides the audio signal to the amplifier unit 14. The amplifier unit 14 amplifies the signal and supplies the amplified signal to the low pass filter 16, which attenuates high frequency components from the amplified signal. High frequency is defined as a frequency above an audible frequency; e.g., approximately 22 kHz. The low pass filter 16 supplies the filtered signal to the loudspeaker 18.

The controller 20 receives the audio signal from the signal source 12 and a digital feedback signal from the AD converter 24. The controller 20 provides a control signal to the power amplifier 22 in response to the received audio and feedback signals. The power amplifier 22 outputs an amplified signal to the filter 16. The amplified signal from the power amplifier 22 is also sent to the AD converter 24.

The amplifier unit 14 provides a substantially distortion free signal to the filter 16. The controller 20 receives the audio signal from the audio signal source 12 and the feedback signal from the AD converter 24. The controller 20 determines and sets, based on the audio and the feedback signals, the output level for the power amplifier 22. The power amplifier 22 may provide a positive or a negative output voltage. The power amplifier 22 may also source or sink current. The power amplifier 22 uses switching power supply techniques to achieve a high efficiency.

The AD converter 24 samples the amplified signal from the power amplifier 22. The AD converter 24 determines an analog voltage value of the sampled signal. The AD converter 24 transmits the feedback signal in the form of a digital voltage value of the sampled signal to the controller 20. The AD converter 24 may have high input impedance, which does not alter the sampled signal. The AD converter 24 samples the amplified signal at regular time intervals. The amplified signal, for example, may be sampled at frequencies of approximately 44 kHz or higher, which is a typical sampling rate for CD audio. As set forth above, the highest audible frequency is approximately 22 kHz. The Nyquist sampling theorem suggests a minimum sampling rate of at least twice this frequency; e.g., the 44 kHz or higher.

The amplified signal is sampled physically close to an input of the low pass filter 16 in order to sense distortions in the amplified signal input into filter 16. The controller 20 controls the power amplifier 22 to compensate for these distortions. The low pass filter 16 removes unwanted high frequency components in the amplified signal and is located upstream of the loudspeaker 18 to compensate for/reduce distortions introduced in the signal path between the filter 16 and the loudspeaker 18.

Figure 2:
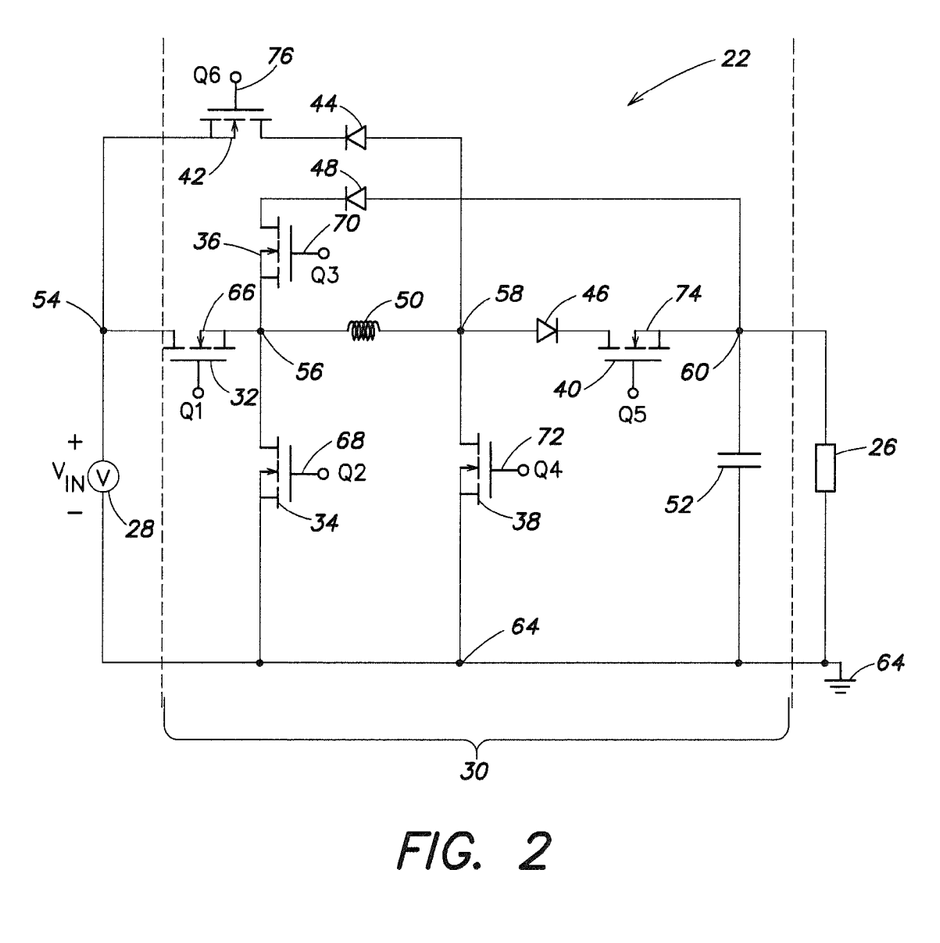
FIG. 2 schematically illustrates an embodiment of a power amplifier included in the amplifier system shown in FIG. 1.

FIG. 2 schematically illustrates an exemplary embodiment of the power amplifier 22. The power amplifier 22 is coupled to a load 26 (e.g., the loudspeaker 18). The power amplifier 22 includes a DC voltage source 28 and a converter circuit 30. The converter circuit 30 includes a plurality of controllable switches 32, 34, 36, 38, 40, 42, a plurality of diodes 44, 46, 48, an inductor 50, a capacitor 52, and a plurality of nodes 54, 56, 58, 60, 62. A first end of the first switch 32 is coupled to a terminal (e.g., the positive terminal) of the DC voltage source 28 at the node 54. A second end of the first switch 32 is coupled to a first end of the second switch 34 at the node 56. A second end of the second switch 34 is coupled to another terminal (e.g., the negative terminal) of the voltage source 28 at the node 62. A first end of the third switch 36 is coupled to the node 56. A second end of the third switch 36 is coupled to a cathode of the third diode 48. A first end of the fourth switch 38 is coupled to the node 62. A second end of the fourth switch 38 is coupled to an anode of the first diode 44 at the node 58. A first end of the fifth switch 40 is coupled to a cathode of the second diode 46. A second end of the fifth switch 40 is coupled to an anode of the third diode 48 at the node 60. A first end of the sixth switch 42 is coupled to the positive terminal of voltage source 28. A second end of the sixth switch 42 is coupled to a cathode of the first diode 44. The controller 20 (see FIG. 1) controls the switches 32 to 42 by control signals Q1-Q6.

The inductor 50 is connected between the node 56 and the node 58. The anodes of the first and the second diodes 44 and 46 are coupled to the node 58. The anode of the third diode 48 is coupled to node 60. The cathodes of the first, the second and the third diodes 44, 46 and 48 are respectively coupled to the sixth switch 42, the fifth switch 40 and the third switch 36. This electrically isolates the diodes 44, 46 and 48 when the sixth, the fifth and the third switches 42, 40 and 36 are open. The capacitor 52 is connected between the nodes 60 and 62. The load 26 is connected between the nodes 60 and 62. The node 62 is connected to an electrical ground 64. The load 26 may have resistive, capacitive, and inductive components. The basic energy storage elements of the converter circuit 30 include the inductor 50 and the capacitor 52.

Each of the switches 32, 34, 36, 38, 40 and 42 may be a semiconductor switch such as, but not limited to, a metal-oxide-semiconductor-field-effect transistor (MOSFET) and/or a bipolar transistor. For example, in the embodiment shown in FIG. 2, each switch is an n-channel metal-oxide-semiconductor field-effect (NMOSFET) transistor. The transistor may be an enhancement type transistor. The transistor includes a source connected to a substrate that depletes stray electrons in the substrate.

Each of the transistors has a relatively high resistance between the source and its drain. An n-channel is formed between the source and the drain when a positive potential difference relative to the source is applied to a respective gate. The positive potential difference reduces the resistance between the source and the drain. When a positive potential difference relative to the source is applied to the drain, electrons flow from the source to the drain. Electrical current therefore flows from the drain to the source. Accordingly, the drain of the first transistor 66 is coupled to the positive terminal of the voltage source 28.

The source and the substrate of the first transistor 66 are connected together. The source of the first transistor 66 is coupled to the drain of the second transistor 68 forming the node 56. The source and the substrate of the second transistor 68 are connected together. The source of the second transistor 68 is coupled to the negative terminal of the voltage source 28 forming the node 62. The source of the third transistor 70 is coupled to the node 56. The drain of the third transistor 70 is coupled to the cathode of the third diode 48. The source and the substrate of third transistor 70 are connected together. The source of fourth transistor 72 is coupled to the node 62. The source and the substrate of fourth transistor 72 are connected together. The drain of the fourth transistor 72 is coupled to the anode of the second diode 46 forming the node 58.

The drain of the fifth transistor 74 is coupled to the cathode of the second diode 46. The source and the substrate of the fifth transistor 74 are connected together. The source of the fifth transistor 74 is coupled to the anode of the third diode 48 forming the node 60. The source of the sixth transistor 76 is coupled to the positive terminal of the voltage source 28. The drain of the sixth transistor 76 is coupled to the cathode of the first diode 44. The source and the substrate of sixth transistor 76 are connected together. The gates of each of the transistors are coupled to the controller 20 (see FIG. 1).

Figure 3:
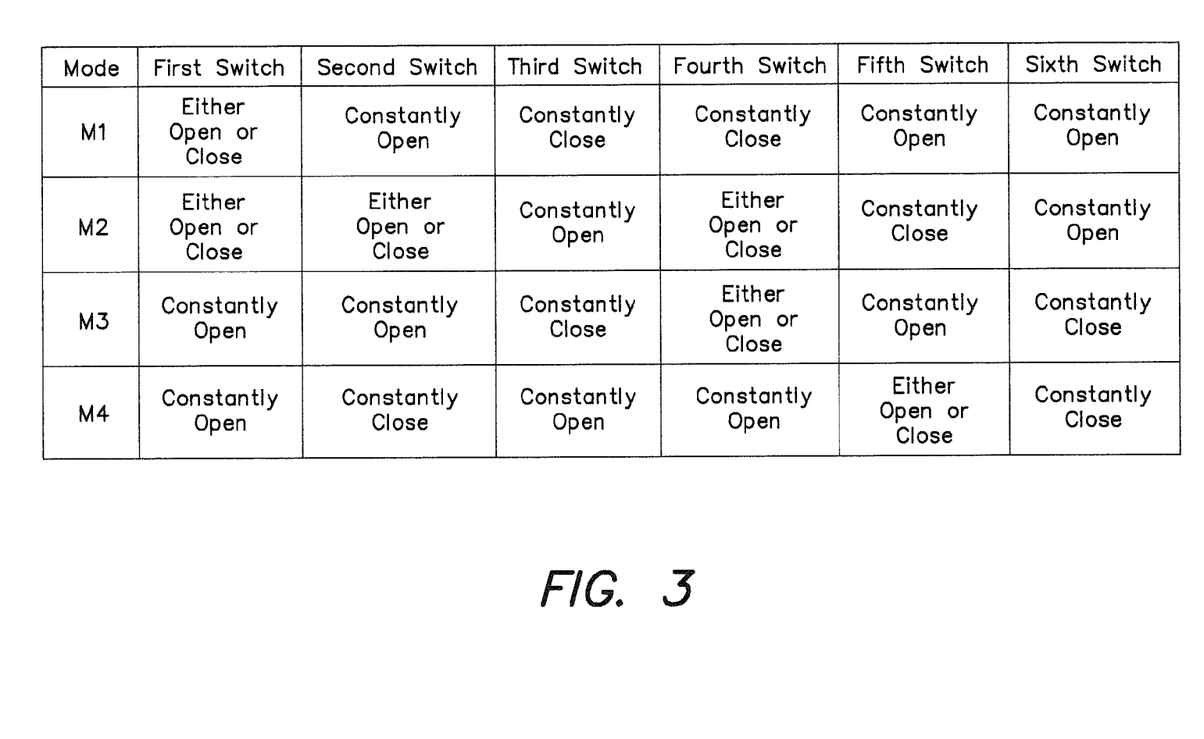
FIG. 3 is a table showing operating modes of the power amplifier shown in FIG. 2.

Referring to FIG. 3, the converter circuit 30 shown in FIG. 2 has four operating modes. Each mode is selected by changing the positions of the switches 32, 34, 36, 38, 40 and 42. The positions of the switches determine whether the converter circuit 30 transfers a positive or a negative voltage to the load 26, and whether the converter circuit 30 sources or sinks current to the load 26.

In the first mode M1, the second, the fifth and the sixth switches 34, 40 and 42 are open, and the third and the fourth switches 36 and 38 are closed. The converter circuit 30 therefore transfers a negative voltage from the voltage source 28 to the load 26.

In the second mode M2, the third and the sixth switches 36 and 42 are open and the fifth switch 40 is closed. The converter circuit 30 therefore transfers a positive voltage from the DC voltage source 28 to the load 26.

In the third mode M3, the first, the second and the fifth switches 32, 34 and 40 are open, and the third and the sixth switches 36 and 42 are closed. The converter circuit 30 therefore sinks a current from the load 26 generating a positive voltage.

In the fourth mode M4, the first, the third and the fourth switches 32, 36, and 38 are open and the second and the sixth switches 34 and 42 are closed. The converter circuit 30 therefore sinks current from the load 26 generating a negative voltage.

Figure 4:
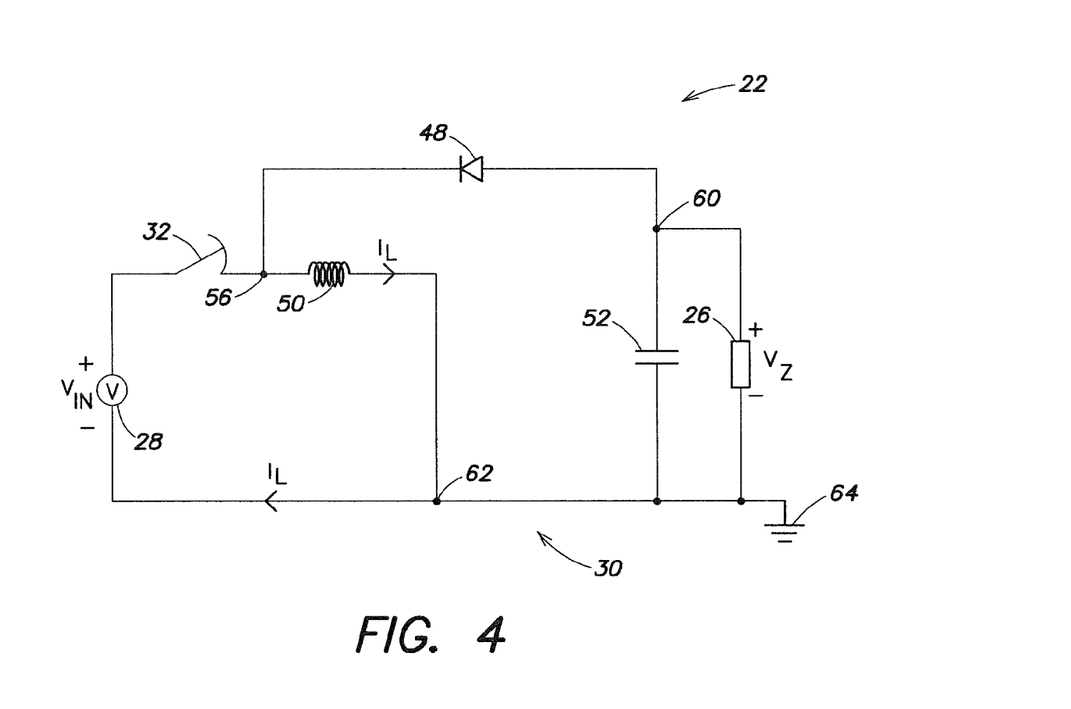
FIGS. 4-15 schematically illustrate the power amplifier of FIG. 2 operating in the modes shown in FIG. 3.
Figure 5:
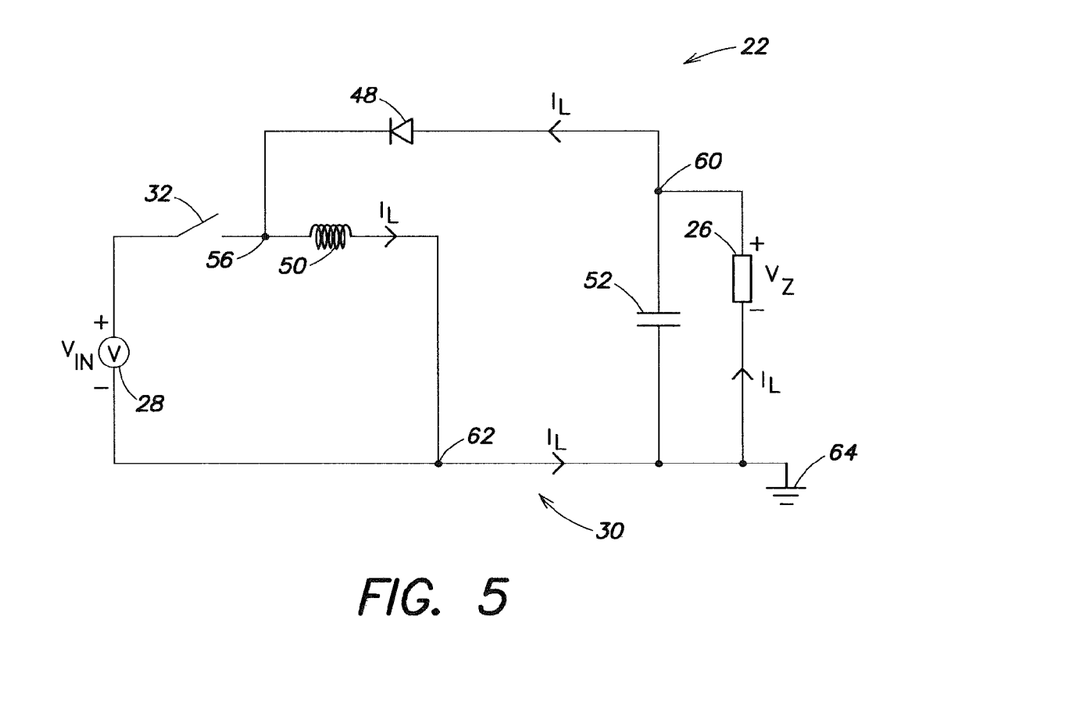
Figure 6:
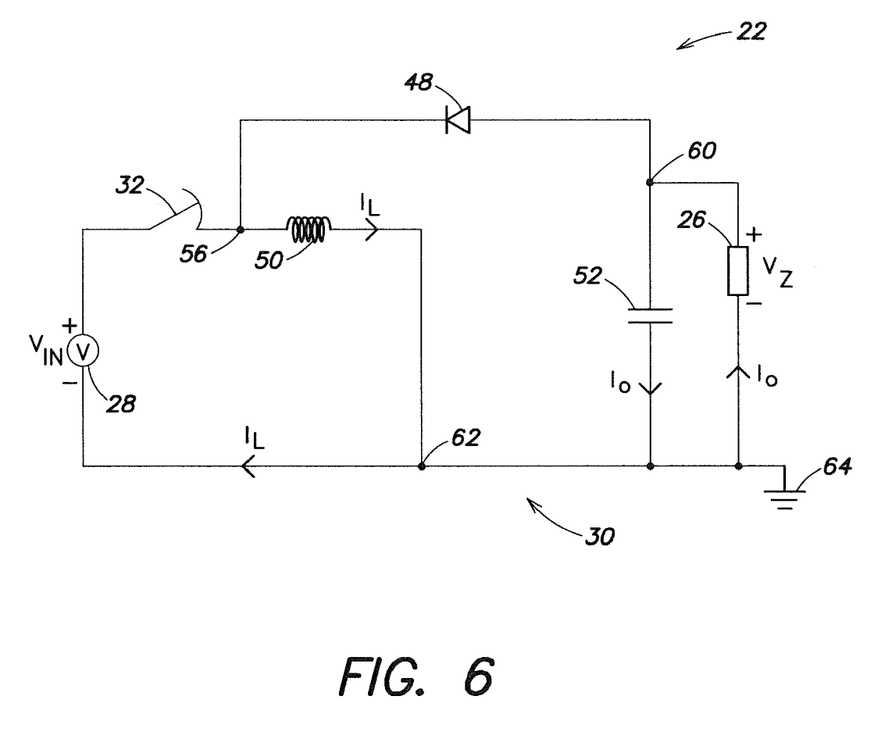

Referring to FIGS. 4, 5 and 6, the converter circuit 30 is shown in the first operating mode M1. Inactive circuit elements are not shown in order to simplify the figures. The second, the fifth and the sixth switches 34, 40 and 42 (not shown) are open. The third and the fourth switches 36 and 38 (not shown) are closed. The third and the fourth switches 36 and 38 are replaced by short circuits for the ease of illustration. The first switch 32 is toggled between its open and its closed position by the controller 20 (see FIG. 1). The converter circuit 30 transfers a negative voltage from the DC voltage source 28 to the load 26. The converter circuit 30 operates in a "buck-boost" converter type manner.

Referring to FIG. 4, the first switch 32 is shown in the closed position. A DC voltage $V_{IN}$ from the voltage source 28 is applied to the inductor 50 and the series circuit of the third diode 48 and the load 26. The voltage $V_{IN}$ energizes the inductor 50 inducing a current $I_L$ to flow therethrough. The voltage $V_{IN}$ does not induce a current flow through the series circuit of the third diode 48 and the load 26, however, because the third diode 48 blocks current from flowing in a direction from its cathode to its anode.

Referring to FIG. 5, the first switch 32 is shown in the open position. The current $I_L$ from the energized inductor 50 flows into the load 26 and charges the capacitor 52. The current $I_L$ flows from the node 62 to the node 60. The voltage $V_Z$ generated at the node 60 and the inductor 50, with reference to electrical ground, therefore is negative. The voltage $V_Z$ increases as energy from the inductor 50 is transferred to the capacitor 52 and the load 26. The voltage $V_Z$ is smaller than the voltage $V_{IN}$.

Referring to FIG. 6, the first switch 32 is shown in the closed position. The current $I_L$ from the inductor 50 stops flowing into the load 26. The current $I_O$ from the charged capacitor 52, however, flows into the load 26. The voltage $V_Z$ decreases as the energy in the capacitor 52 discharges. The closing and the opening of the first switch 32 therefore transfers the negative voltage $V_Z$ to the load 26. The voltage $V_Z$ rises and falls as the inductor 50 and the capacitor 52 are charged and discharged.

Referring to FIGS. 7, 8, 9, 10 and 11, the converter circuit 30 is shown in the second operating mode M2. Inactive circuit elements are not shown in the interest of illustration. The third and the sixth switches 36 and 42 (not shown) are open. The fifth switch 40 is closed. A short circuit replaces the fifth switch 40. The converter circuit 30 converts the voltage $V_{IN}$ from the DC voltage source 28 to a positive voltage $V_Z$. The positive voltage $V_Z$ is applied to the load 26.

The second operating mode M2 has two states. In the first state, the voltage $V_{IN}$ is greater than the voltage $V_Z$. In the second state, the voltage $V_{IN}$ may be less than the voltage $V_Z$.

Figure 7:
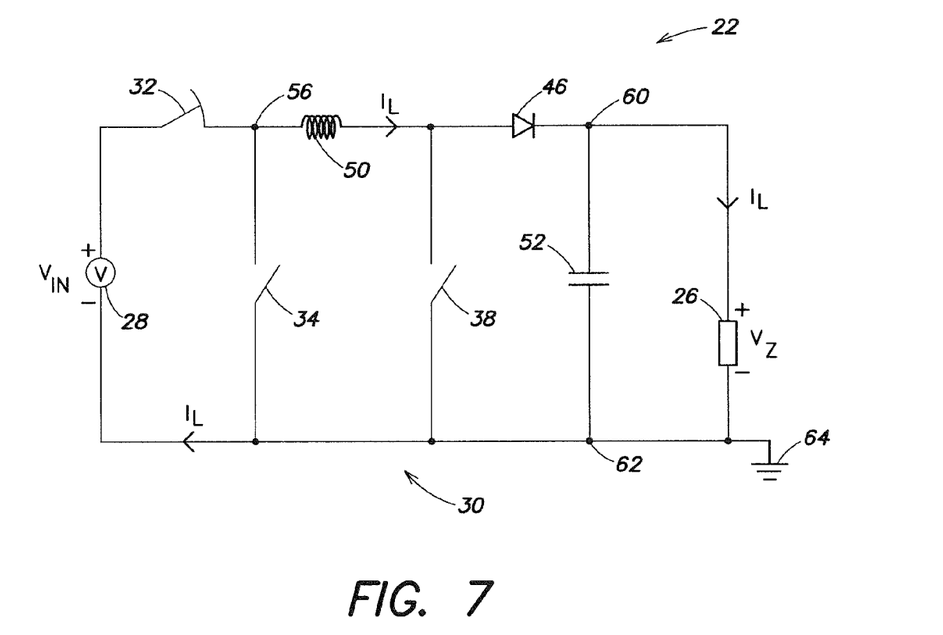
Figure 8:
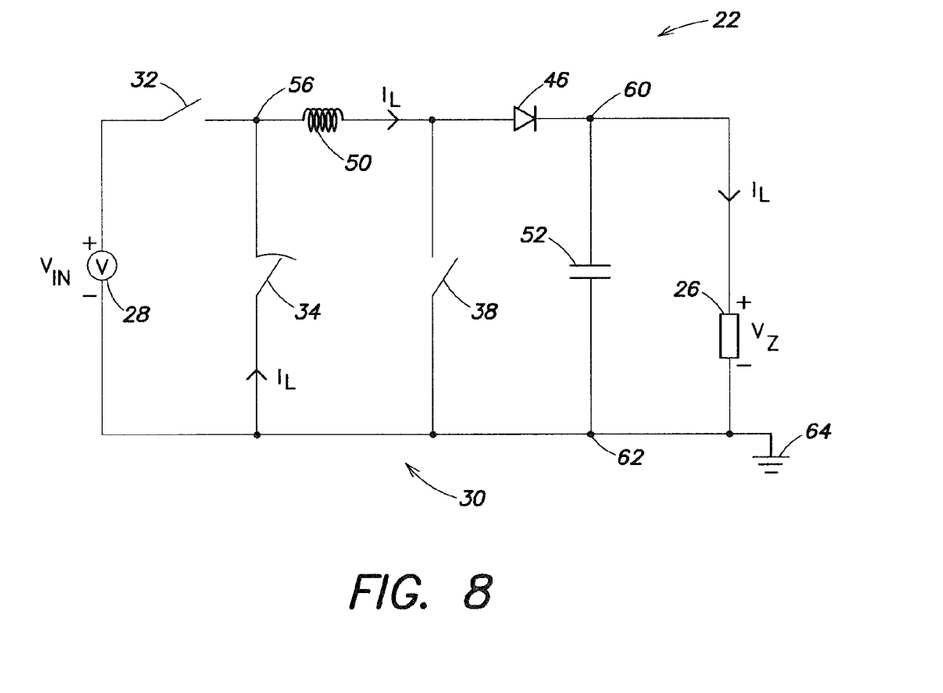

Referring to FIGS. 7 and 8, the converter circuit 30 is shown in the first state of the second operating mode M2. The fourth switch 38 is open. The first and the second switches 32 and 34 are toggled between their open and their closed positions by the controller 20 (see FIG. 1). For example, the controller 20 opens the first switch 32 when the second switch 34 is closed. The controller 20 closes the first switch 32 when the second switch 34 is open. The converter circuit 30 operates in a "buck" converter manner.

Referring to FIG. 7, the first switch 32 is shown in the closed position, and the second switch 34 is shown in the open position. The voltage $V_{IN}$ from DC voltage source 28 is applied across the series circuit of the inductor 50, the second diode 46 and the load 26. The inductor 50 is energized such that the current $I_L$ flows through the inductor 50 into the load 26. The current $I_L$ flows from the node 60 to the node 62. The voltage $V_Z$ across the load 26 increases as the current $I_L$ begins to flow. The voltage $V_Z$ at node 60 and across the inductor 50, with reference to electrical ground 64, therefore is positive. The voltage $V_{IN}$ is greater than the voltage $V_Z$.

Referring to FIG. 8, the first switch 32 is shown in the open position, and the second switch 34 is shown in the closed position. The current $I_L$ from the energized inductor 50 flows into the load 26. The current flow depletes the energy in the inductor 50 thereby reducing the magnitude of the current $I_L$ and the voltage $V_Z$. The first and the second switches 32 and 34 are toggled between their open and their closed positions transferring the positive voltage $V_Z$ to the load 26. The voltage $V_Z$ rises and falls as the energy in the inductor 50 charges and discharges with the opening and the closing of the first and the second switches 32 and 34.

Figure 9:
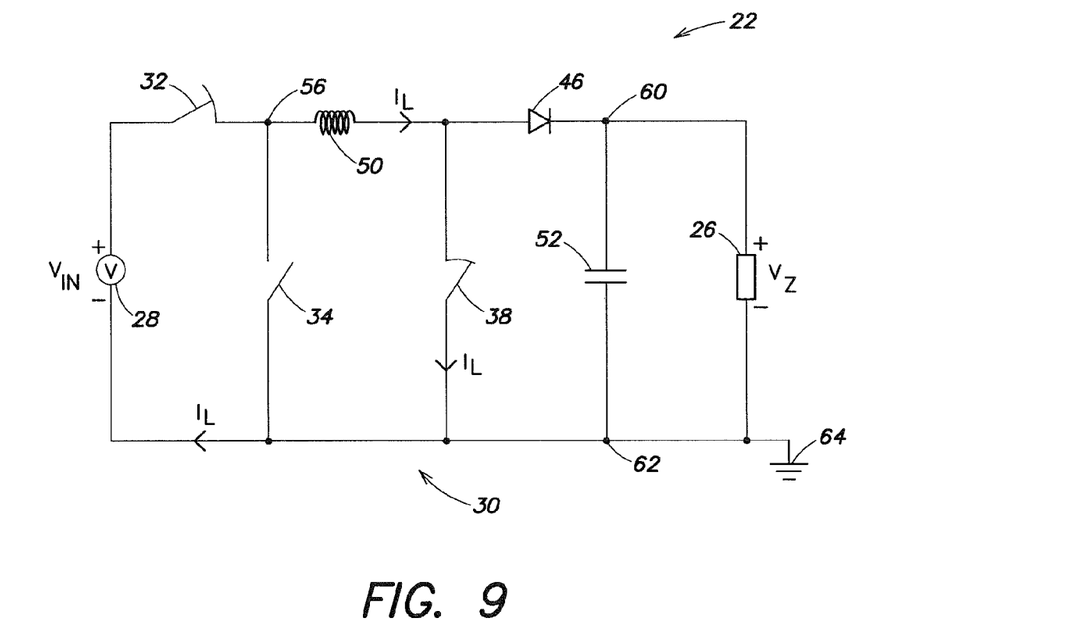
Figure 10:
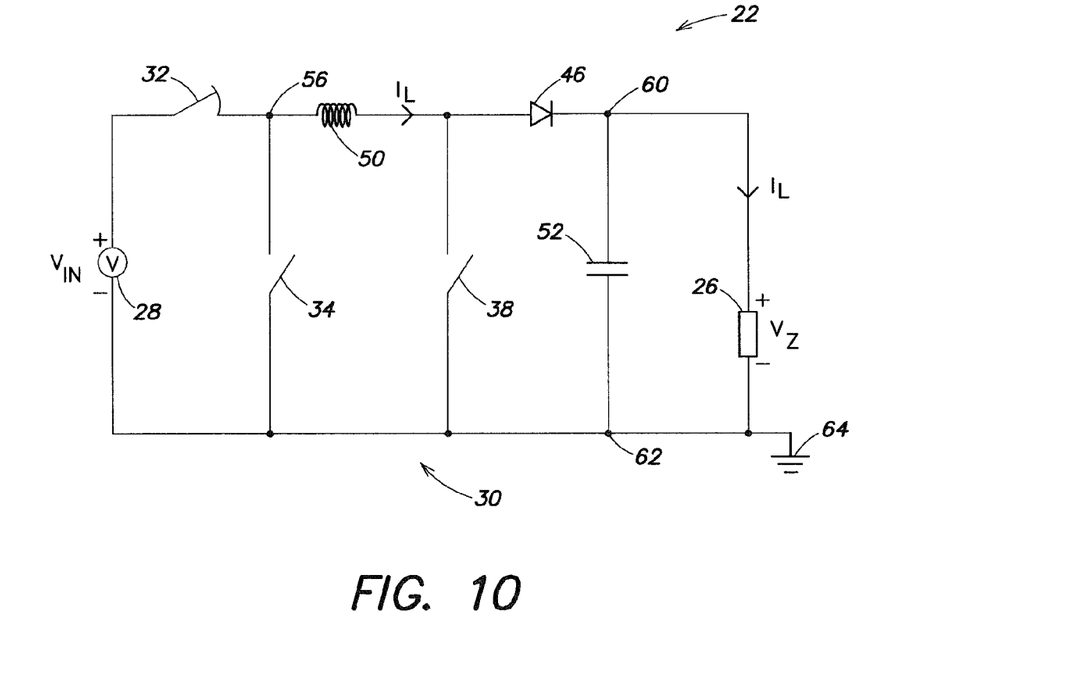
Figure 11:
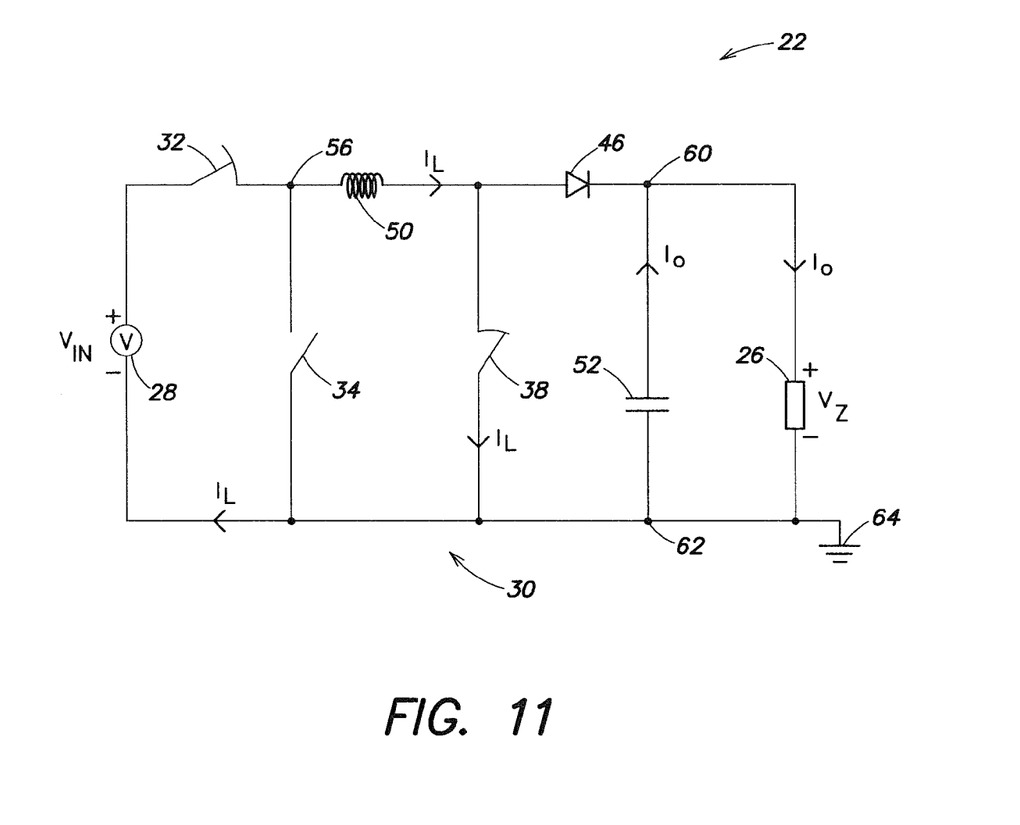

Referring to FIGS. 9, 10 and 11, the converter circuit 30 is shown in the second state of the second operating mode M2. The first switch 32 is closed, and the second switch 34 is open. The fourth switch 38 is toggled between its open and its closed positions by the controller 20 (see FIG. 1). The circuit 30 operates in a "boost" converter type manner.

Referring to FIG. 9, the fourth switch 38 is shown in the closed position. The voltage $V_{IN}$ from the DC voltage source 28 is applied across the inductor 50. The inductor 50 is energized and induces the current $I_L$ to flow therethrough.

Referring to FIG. 10, the fourth switch 38 is shown in the open position. The energized inductor 50 acts like a voltage source. The potential difference across the inductor 50 and the DC voltage source 28 is applied across the second diode 46 and the load 26. The voltage $V_Z$ across the load 26 rises as current begins to flow into the load 26. The voltage $V_Z$ can rise to a level greater than the voltage $V_{IN}$ due to the additional energy received from the energized inductor 50 in series with the voltage source 28. The capacitor 52 is also charged. The energy in the inductor 50 depletes as the current $I_L$ flows therefrom.

Referring to FIG. 11, the fourth switch 38 is shown in the closed position. The DC voltage source 28 energizes the inductor 50. The current $I_O$ flows from the charged capacitor 52 into the load 26. The voltage $V_Z$ falls as the energy in the capacitor 52 is discharged. The fourth switch 38 is toggled between its open and its closed positions. A positive voltage $V_Z$ therefore is transferred to the load 26. The voltage $V_Z$ may be greater than the voltage $V_{IN}$. The voltage $V_Z$ rises and falls as the energy in the inductor 50 charges and discharges with the opening and the closing of the fourth switch 38.

Figure 12:
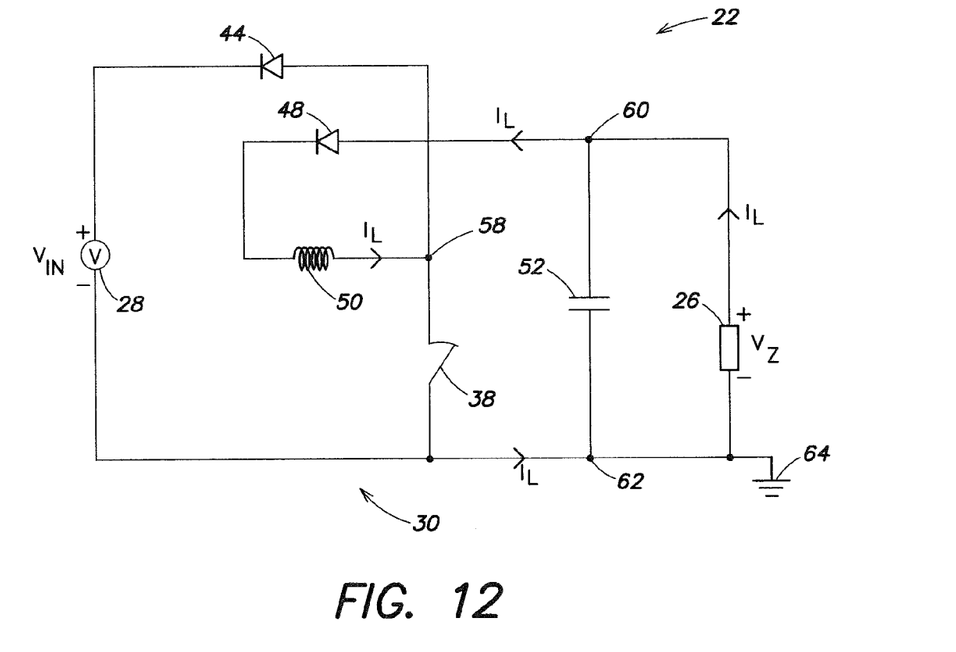
Figure 13:
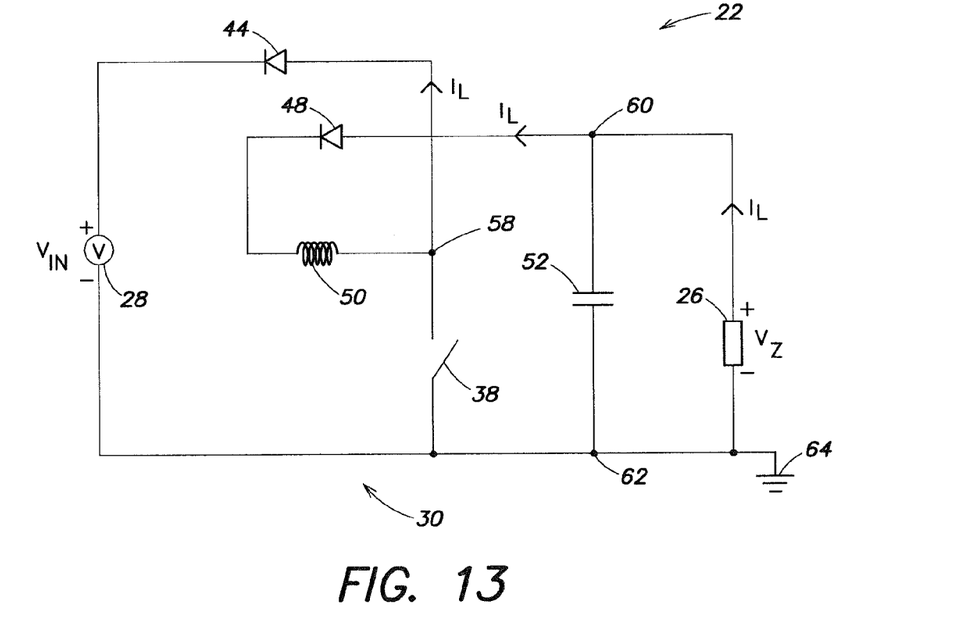

Referring to FIGS. 12 and 13, the converter circuit 30 is shown in the third operating mode M3. Inactive circuit elements are not shown in the interest of ease of illustration. The first, the second and the fifth switches 32, 34 and 40 (not shown) are open. The third and the sixth switches 36 and 42 (not shown) are held in closed. Short circuits replace the third and the sixth switches 36 and 42. The fourth switch 38 is toggled between its open and its closed positions by the controller 20 (see FIG. 1). The inactive circuit elements are omitted in FIGS. 12 and 13. The converter circuit 30 absorbs energy from the load 26 which has a positive voltage. The converter circuit 30 operates in "buck" converter manner such that the circuit draws energy from the load 26.

Referring to FIG. 12, the fourth switch 38 is shown in the closed position. The voltage $V_Z$ across load 26 is applied to the series circuit of the third diode 48 and the inductor 50. A current $I_L$ is flows through the inductor 50 from the node 60 to the node 58. This energizes the inductor 50 and depletes the energy in the load 26.

Referring to FIG. 13, the fourth switch 38 is shown in the open position. The energized inductor 50 acts like a voltage source. The voltage across the load 26 and across the energized inductor 50 is applied to the series circuit of the voltage source 28 and the first and the third diodes 44 and 48. The current $I_L$ depletes the energy in the inductor 50. Energy in the load 26 that has a positive voltage therefore is discharged.

Figure 14:
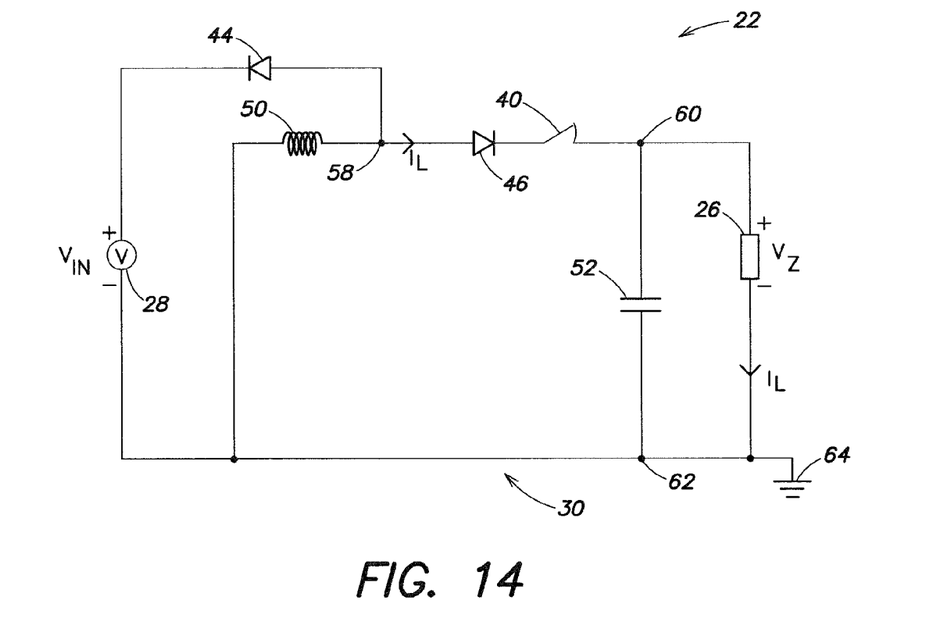
Figure 15:
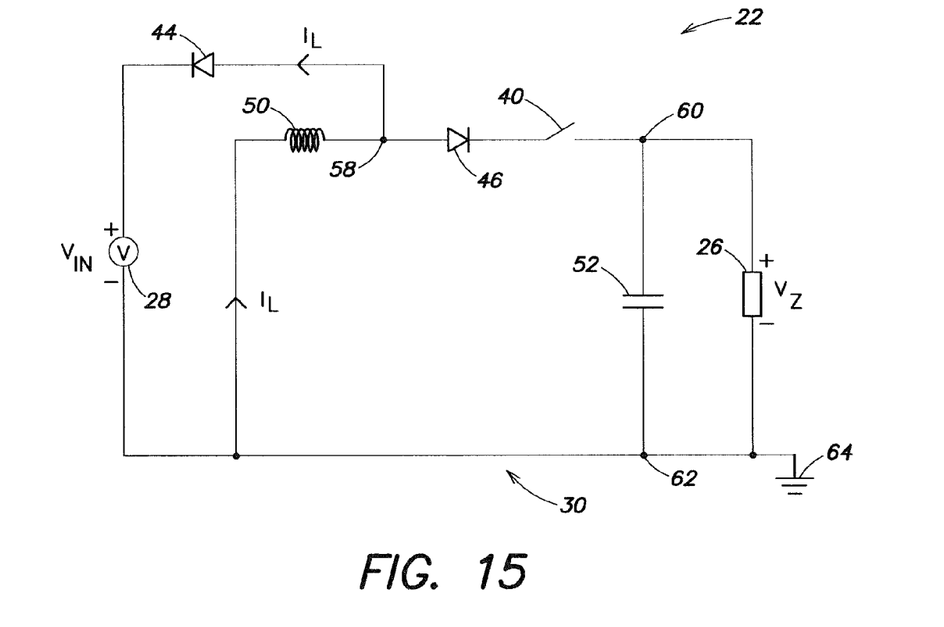

Referring to FIGS. 14 and 15, the converter circuit 30 is shown in the fourth operating mode M4. Inactive circuit elements are not shown in order to simplify the figures. The first, the third and the fourth switches 32, 36, and 38 (not shown) are open. The second and the sixth switches 34 and 42 (not shown) are closed. Short circuits replace the second and the sixth switches 34 and 42. The fifth switch 40 is toggled between its open and its closed positions by the controller 20 (see FIG. 1). The converter circuit 30 absorbs energy from the load 26 which has a negative voltage. The converter circuit 30 operates in a "buck-boost" converter type manner where the circuit reduces the energy stored in load 26.

Referring to FIG. 14, the fifth switch 40 is shown in the closed position. The voltage $V_Z$ across the load 26 is applied across the series circuit of the second diode 46 and the inductor 50. The load 26 has a negative voltage. The current $I_L$ flows through the inductor 50 from the node 62 to the node 58. The inductor 50 is therefore energized, which depletes the energy in the load 26.

Referring to FIG. 15, the fifth switch 40 is shown in the open position. The current $I_L$ flows into the first diode 44 and the voltage source 28 such that the current $I_L$ reduces the energy in the inductor 50 and, thus, the voltage across the load 26.

Figure 16:
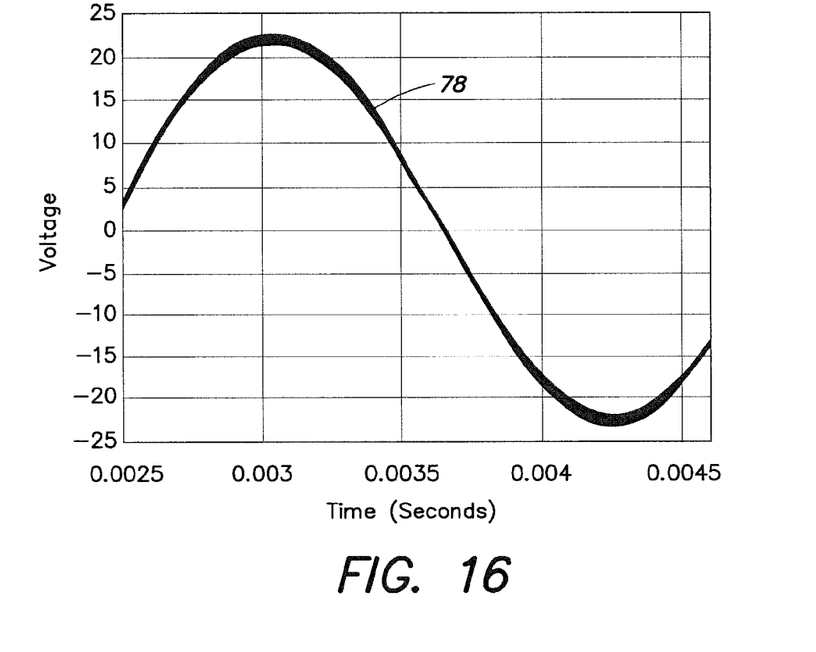
FIG. 16 graphically illustrates an output of the amplifier system shown in FIG. 1.

Referring to FIG. 16, the output voltage of the converter circuit 30 is shown as a curve 78. The curve 78 is a sinusoidal waveform. The curve 78 starts at 2.5 milliseconds (ms) with a value of approximately 3 volts. The curve 78 rises to approximately 23 volts at 3.1 ms. The curve 78 then falls to approximately negative 24 volts at 4.3 ms. The curve 78 rises to approximately negative 15 volts at 4.6 ms. The curve 78 has a "maximum" thickness of about 1 volt at approximately 3.1 ms and approximately 4.3 ms. The thickness of the curve 78 shows the range of variation of the output of the converter circuit 30. The thickness of the curve 78 represents a saw-tooth shaped line (see FIG. 17). Due to its saw-tooth shape, curve 78 fluctuates at high frequencies.

Figure 17:
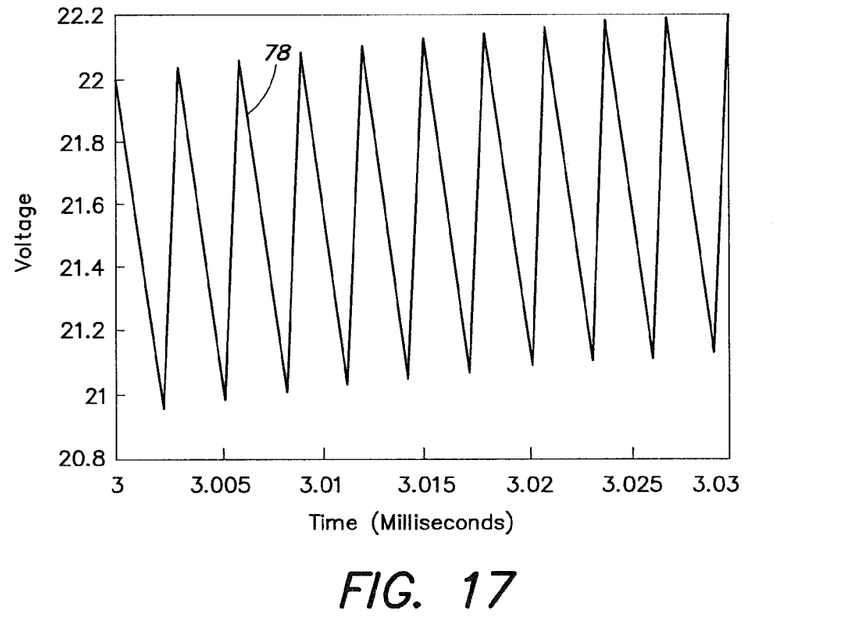
FIG. 17 shows an enlarged portion of the graph illustrated in FIG. 16.

Referring to FIG. 17, an enlarged portion of the saw-tooth shaped curve 78 is shown at approximately 300 kilohertz (kHz). The curve 78 starts at 3.00 ms and ends at 3.03 ms. The curve 78 varies between approximately 21 and 22 volts. The curve 78 has a slight upward incline and a peak of approximately 22.00 volt at 3.000 ms. The curve 78 has a peak of approximately 22.18 volts at 3.027 ms. The frequency of the curve 78 corresponds with the toggling frequency of the switches of the circuit 30 of FIG. 2. The output voltage of the converter circuit 30 has a triangle waveform rather than a rectangle form. The distortion level introduced by the triangle waveform is at high frequencies. The level of distortion is reduced here according to the $1/f^2$ rule and rather than the $1/f$ rule. The disturbance level therefore is very low.

Although various examples to realize the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Such modifications to the inventive concept are intended to be covered by the appended claims.

What is claimed is:

1. A switched mode amplifier that receives an input signal and a supply voltage source, comprising:
   a switched amplifier that sources or sinks a negative or a positive current to or from a load, where the load and the current define a voltage over the load, the switched amplifier comprising
   an inductor connected between first and second nodes;
   a first controllable switch connected between the first node and a third node;
   a second controllable switch connected between the first node and a fourth node;
   a third controllable switch and a first diode connected between the first node and a fifth node;
   a fourth controllable switch connected between the second node and the fourth node;
   a fifth controllable switch and a second diode connected between the second node and the fifth node; and
   a sixth controllable switch and a third diode connected between the third node and the second node;
   where the supply voltage source is connected between the third and the fourth nodes, and where the load is connected between the fifth and the fourth nodes;
   a controller that generates control signals for the switched amplifier in response to an input signal and a feedback signal, where the controller controls the controllable switches using the control signals; and
   a feedback unit connected to the controller and the load, where the feedback unit generates the feedback signal from the voltage over the load.

2. The amplifier of claim 1, where the controllable switches are controlled as a function of the input signal such that the switched amplifier operates as one of a non-inverting buck converter, a non-inverting boost converter, an inverting buck converter, and an inverting boost converter.

3. The amplifier of claim 1, further comprising a capacitor connected between the fifth node and the fourth node.

4. The amplifier of claim 1, further comprising a filter connected upstream of the load.

5. The amplifier of claim 4, where the filter comprises a low pass filter.

6. The amplifier of claim 1, where the feedback unit comprises an analog-to-digital converter.

7. The amplifier claim 1, where each of the controllable switches comprises a semiconductor device.

8. The amplifier of claim 7, where the semiconductor device comprises a MOSFET.

9. The amplifier of claim 8, where the MOSFET comprises an enhancement type transistor.

10. The amplifier of claim 1, wherein the controller comprises a digital signal processor.

11. An amplification circuit, comprising:

a switched amplifier comprising first, second, third, fourth, fifth and sixth switches;

a first diode connected to the sixth switch in a first serial connection;

a second diode connected to the fifth switch in a second serial connection;

a third diode connected to the third switch in a third serial connection;

an inductor having a first terminal and a second terminal, where the first terminal is connected to the first switch, the second switch and the third serial connection, and where the second terminal is connected to the fourth switch, the first serial connection and the second serial connection;

an output that provides an amplified audio signal, where the output is connected to the inductor through the second and the third serial connections;

a ground connected to the inductor through the second and the fourth switches; and an input that receives a voltage, where the input is connected to the inductor through the first switch and the first serial connection.

12. The circuit of claim 11, further comprising a feedback loop and a controller, where the feedback loop is connected between the output of the switched amplifier and the controller, and where the controller controls each of the switches in response to an input signal and a feedback signal from the feedback loop.

\* \* \* \* \*